(12) United States Patent
Sung et al.

(10) Patent No.: US 6,826,070 B2
(45) Date of Patent: Nov. 30, 2004

(54) READ ONLY MEMORY(ROM) CELL, PROGRAM METHOD OF ROM CELL, LAYOUT METHOD OF ROM CELL, AND ROM DEVICE COMPRISING ROM CELL

(75) Inventors: Nak-Woo Sung, Seoul (KR); Yong-Jae Choo, Seoul (KR); Hyoung-Yun Byun, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/453,658

(22) Filed: Jun. 4, 2003

(65) Prior Publication Data
US 2004/0022084 A1 Feb. 5, 2004

(30) Foreign Application Priority Data
Aug. 1, 2002 (KR) ......................... 2002-45692

(51) Int. Cl.⁷ .............................................. G11C 17/00
(52) U.S. Cl. ........................................ 365/94; 265/104
(58) Field of Search ..................... 365/94, 103, 104, 365/72

(56) References Cited
U.S. PATENT DOCUMENTS 6,618,282 B1 * 9/2003 Poplevine et al. ............ 365/94
6,636,434 B2 * 10/2003 Poullet .......................... 365/94

* cited by examiner

Primary Examiner—Tan T. Nguyen
(74) Attorney, Agent, or Firm—Harness, Dickey & Pierce, P.L.C.

(57) ABSTRACT

A read only memory (ROM) cell, a method for programming a ROM cell, a method for forming a layout of a ROM cell, and a ROM device including ROM cells are disclosed. The ROM cell includes a gate connected to a word line, a drain (or a source) connected to a bit line, and a source (or a drain) connected to a ground voltage line, a first selection signal line or a second selection signal line, or having no connection with the first and second selection signal lines, wherein the ROM cell is programmed with data "00" by connecting the source (or the drain) to the ground voltage line, with data "10" by connecting the source (or the drain) to the first selection signal line, with data "01" by connecting the source (or the drain) to the second seletion signal line and data "11" by not connecting the source (or the drain) to any signal lines. The ROM cell can store two bits of data, and the ROM cell can decrease layout size since an additional circuit is not needed to decrease difference of parasitic capacitances between bit lines.

21 Claims, 11 Drawing Sheets

READ ONLY MEMORY (ROM) CELL, PROGRAM METHOD OF ROM CELL, LAYOUT METHOD OF ROM CELL, AND ROM DEVICE COMPRISING ROM CELL

BACKGROUND OF INVENTION

This U.S. nonprovisional patent application claims priority under 35 U.S.C. §119 of Korean Patent Application 2002-45692 filed on Aug. 1, 2002, the entire contents of which are hereby incorporated by reference.

1. Field of the Invention

The present invention relates to a semiconductor memory device, and more particularly, to a read only memory(ROM) cell capable of storing at least two bits of data, a program method of the ROM cell, a layout method of the ROM cell, and a ROM device comprising the ROM cell.

2. Description of Related Art

A conventional read only memory (ROM) device includes a plurality of ROM cells, each having an NMOS transistor with a source connected to a ground voltage, a drain connected or not connected to a bit line and a gate connected to a word line.

Data "0" of the conventional ROM cell is programmed by connecting the drain of the NMOS transistor to the bit line and data "1" of the conventional ROM cell is programmed by not connecting the drain of the NMOS transistor to the bit line. That is, data "0" is programmed in the ROM cell by forming a discharging path through the NMOS transistor and data "1" is programmed in the ROM cell by not forming the discharging path through the NMOS transistor. Generally, such programming is accomplished using a front-end layer forming the NMOS transistor of the ROM cell to more highly integrate the ROM cells in a ROM device.

FIG. 1 illustrates a block diagram of a conventional ROM device. Referring to FIG. 1, the ROM device includes a memory cell array 10, a row decoder 12, a pre-charge circuit 14, a data transmission gate 16, a column decoder 18, and a data output circuit 20. The ROM device also includes a plurality of bit lines BL1–BLj and a plurality of word lines WL1–WLi. The operation of each block in FIG. 1 is described below.

The memory cell array 10 includes a plurality of memory cells, each cell having a gate connected to a corresponding word line of word lines WL1–WLi, a source connected to a ground voltage line and a drain connected or not connected to a corresponding one of bit lines BL1–BLj. The ROM cell having a drain connected to the bit line is programmed with data "0". The ROM cell having a drain not connected to the bit line is programmed with data "1". The row decoder 12 decodes a row address RA and selects one of the word lines WL1–WLi. The pre-charge circuit 14 pre-charges the bit lines BL1–BLj to a logic "high" level during a pre-charge operation. The data transmission gate 16 transfers data from the bit lines BL1–BLj to the data output circuit 20, in response to respective column selection signals Y1–Yj. The column decoder 18 decodes a column address CA and selects a column selection signal of the column selection signals Y1–Yj. The data output circuit 20 receives the data from the data transmission gate 16 and outputs an output data Dout. The overall operation of the conventional ROM device is described below.

During a read operation, the pre-charge circuit 14 pre-charges the bit lines BL1–BLj to a logic "high" level.

A word line WL1 is selected and NMOS transistors N connected to the word line WL1 are turned on. If bit lines BL1 and BLj are connected to the ground voltage line, current flows from the bit lines BL1 and BLj to the ground. As a result, the bit lines BL1 and BLj have a logic "low" level. If a bit line BL2 is not connected to the ground voltage line, charges are not drawn to the ground voltage line, so that the bit line BL2 maintains a logic "high" level.

If a column selection signal Y1 is generated, a logic "low" level of the bit line BL1 is output from the data transmission gate 16.

As described above, the conventional ROM device is disadvantageous in that it stores only one bit of data into a cell.

Further, the conventional ROM device is disadvantageous in that there is a difference in parasitic capacitances between bit lines, which negatively affects circuit operation. Accordingly, an additional circuit for compensating for parasitic capacitance difference is necessary. The additional circuit may cause problems, such as layout area increase, power consumption increase and slow operating speed.

Minimum parasitic capacitance and maximum parasitic capacitance of the bit line are obtained as follow. If all the NMOS transistors connected to the same bit line are programmed to store data "0", the parasitic capacitance of the bit line is obtained by following equation:

$$\text{Parasitic Capacitance} = i \times \text{drain capacitance of an NMOS transistor} + \text{line capacitance of a bit line,} \quad (1)$$

where i denotes the number of NMOS transistors connected to a bit line.

In the case that all the NMOS transistors connected to the same bit line are programmed to store data "1", the parasitic capacitance of the bit line is obtained by following equation:

$$\text{Parasitic Capacitance} = 0 \times \text{drain capacitance of an NMOS transistor} + \text{line capacitance of a bit line} \quad (2)$$

As a result, a difference between the maximum and minimum parasitic capacitances of bit lines equals i×drain capacitance of an NMOS transistor.

FIG. 2 illustrates another conventional ROM device. The ROM device of FIG. 2 is similar to the ROM device of FIG. 1 except that adjacent NMOS transistors N have a common source, connected to a ground voltage line. The ROM device of FIG. 2 employs only one ground voltage line unlike the ROM device of FIG. 1 in which two ground voltage lines are employed. Accordingly, a layout area of the ROM device of FIG. 2 may be smaller than that of the ROM device shown in FIG. 1.

However, even though the ROM device of FIG. 2 has an advantage in that the layout area is smaller, the ROM device of FIG. 2 has the same other disadvantages as the ROM device of FIG. 1.

Further, in the case of programming the ROM cell using a back-end layer, an active area is designed to dominate an additional area. Accordingly, a layout area of the ROM cell programmed using the back-end layer is larger than that of a ROM cell programmed using a front-end layer. Therefore, the ROM cell is generally programmed by using the front-end layer to increase integration density.

When programming the ROM cell using a front-end layer, since programming may be performed before data to be stored in the ROM cell is determined or confirmed, the programmed ROM device should be re-programmed in several times due to a customer's demand. Accordingly, back-end layer programming is more convenient than front-end layer programming.

SUMMARY OF THE INVENTION

In exemplary embodiments, the present invention provides a read only memory (ROM) cell capable of storing at least two bits of data, in which parasitic capacitances of respective bit lines are substantially the same.

In exemplary embodiments, the present invention also includes a method for programming a ROM cell and a layout method of a ROM cell. The layout method may reduce the layout size of the ROM cell even though the ROM cell is programmed by using a back-end layer.

In exemplary embodiments, the present invention further provides a ROM device comprising a ROM cell.

In an exemplary embodiment, the present invention provides a read only memory (ROM) cell having a gate connected to a word line, a drain (or a source) connected to a bit line, and a source (or a drain) connected to a ground voltage line, a first selection signal line, a second selection signal line, or not connected to any signal lines. The word line, the bit line and the first and second selection signal lines may be at ground voltage level before a read operation starts, and the word line, the bit line and one of the first and second selection signal lines transit to a power supply voltage level during the read operation. In an exemplary embodiment, the word line may be selected by a row address, and the bit line, the first selection signal line and the second selection signal line may be selected by a column address.

In another exemplary embodiment, the present invention provides a method for programming a ROM cell having a gate connected to a word line, a drain (or a source) connected to a bit line and a source (or a drain). The method comprises the steps of programming the ROM cell with data "00" by connecting the source (or the drain) to a ground voltage line, programming the ROM cell with data "10" by connecting the source (or the drain) to a first selection signal line, programming the ROM cell with data "01" by connecting the source (or the drain) to a second seletion signal line, and programming the ROM cell with data "11" by not connecting the source (or the drain) to any signal lines.

In another exemplary embodiment, the present invention provides a method for forming a layout of a ROM cell having a gate connected to a word line, a drain (or a source) connected to a bit line, and a source (or a drain) connected to a ground voltage line, a first selection signal line, a second selection signal line, or not connected to any signal lines. The method comprises the steps of arranging an active area to act as the drain and the source, arranging a gate area to cross the active area, arranging the bit line on the drain (or the source) to extend in longitudinal direction, arranging a ground voltage line to be in perpendicular or substantially perpendicular to the bit line, and arranging the first and second selection signal lines in the same direction or substantially the same direction as the bit line.

In another exemplary embodiment of the present invention, the step of arranging the bit line includes the steps of forming a first contact and a second contact on the drain (or the source) and the source (or the drain), respectively, arranging a first metal line acting as the bit line on the first contact at the drain (or the source) to extend in longitudinal direction, and arranging a second metal line on the second contact at the source (or the drain) to extend in longitudinal direction.

In another exemplary embodiment of the present invention, the step of arranging the ground voltage line includes the steps of forming a third contact on the second metal line, and forming a third metal line on the third contact and forming a fourth metal line acting as the ground voltage line on the first metal line to extend in a lateral direction.

In another exemplary embodiment of the present invention, the step of arranging the ground voltage line includes the step of arranging the third metal line and the fourth metal line to be connected to each other for programming the ROM cell with data "00".

In another exemplary embodiment, the step of arranging the first and second selection signal lines for programming the ROM cell with data "10" includes the steps of forming a fourth contact on the third metal line, and forming a fifth metal line acting the first selection signal line on the fourth contact in the same or substantially the same direction as the second metal line, and forming a sixth metal line acting the second selection line to extend in the same direction or substantially the same as the first metal line.

In another exemplary embodiment, the step of arranging the first and second selection signal lines for programming the ROM cell with data "01" includes the steps of forming a fourth contact on the third metal line, and forming a fifth metal line acting as the second selection signal line on the fourth contact to extend in the same or substantially the same direction as the first metal line, and forming a sixth metal line acting as the first selection singal line to extend in the same or substantially the same direction as the second metal line.

In another exemplary embodiment, the step of arranging the first and second selection signal lines for programming the ROM cell with data "11" includes the steps of arranging a fifth metal line acting as the first selection signal line to extend in the same or substantially the same direction as the second metal line, and arranging a sixth metal line acting as the second selection signal line to extend in the same or substantially the same direction as the first metal line.

In another exemplary embodiment, the present invention provides a ROM device comprising a plurality of word lines, a plurality of bit lines, a plurality of first selection signal lines, a plurality of second selection signal lines, a plurality of ROM cells, each including a gate connected to a word line of the word lines, a drain (or a source) connected to a bit line of the bit lines and a source (or a drain) connected to a ground voltage line, a first selection signal line of the first selection signal lines, or a second selection signal line of the second selection signal lines, or having no connection with any signal line.

In an exemplary embodiment, the word lines, the bit lines and the first and secod selection signal lines are in ground voltage level before a read operation starts, and a selected word line and bit line of the word lines and bit lines transit to power supply voltage level and one of the first and second selection signal lines transits power supply voltage after the read operation starts.

In another exemplary embodiment, the word lines are selected by decoding a row address, the first and second selection signal linese are selected by decoding a column address including a plurality of bits, and the bit lines are selected by decoding the column address excluding last one bit thereof.

In another exemplary embodiment, the ROM cell is programmed with data "00" when the source is conencted to the ground voltage line.

In another exemplary embodiment, the ROM cell is programmed with data "10" when the source is connected to a first selection signal line of the first selection signal lines.

In another exemplary embodiment, the ROM cell is programmed with data "01" when the source is connected to a second selection signal line of the second selection signal lines.

In another exemplary embodiment, the ROM cell is programmed with data "11" when the source has no electrical connection with any signal line.

BRIEF DESCRIPTION OF THE DRAWINGS

Exemplary embodiments of the present invention will become more fully understand from the detailed description given herein below and the accompanying drawings which are given by way of illustration only, and thus are not limitative of the present invention, and wherein.

DETAILED DESCRIPTION OF EXEMPLARY EMBODIMENTS

The present invention will now be described more fully with reference to the accompanying drawings, in which exemplary embodiments of the invention are shown.

Figure 1:
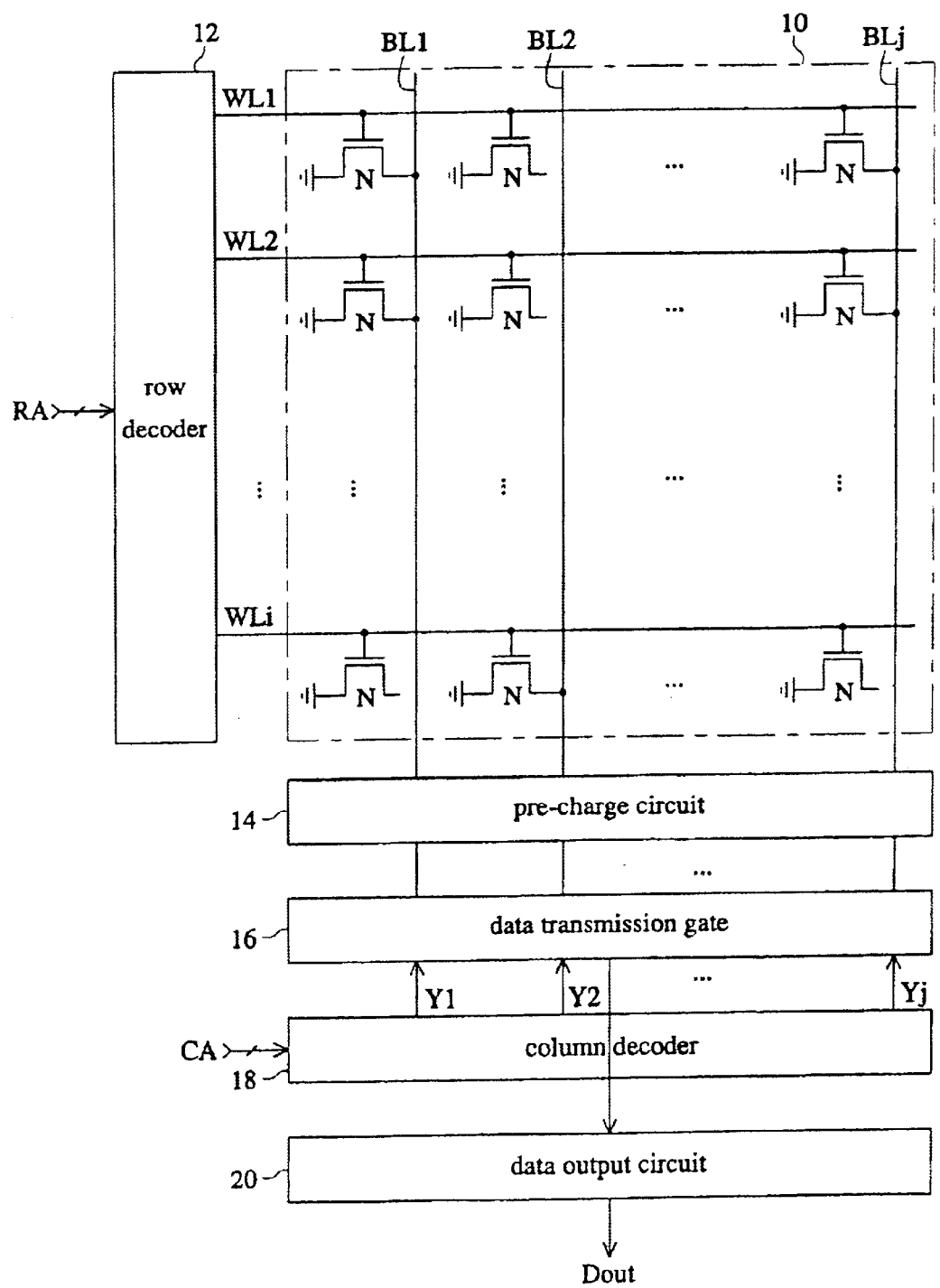
FIG. 1 illustrates a block diagram of a conventional read only memory device.
Figure 2:
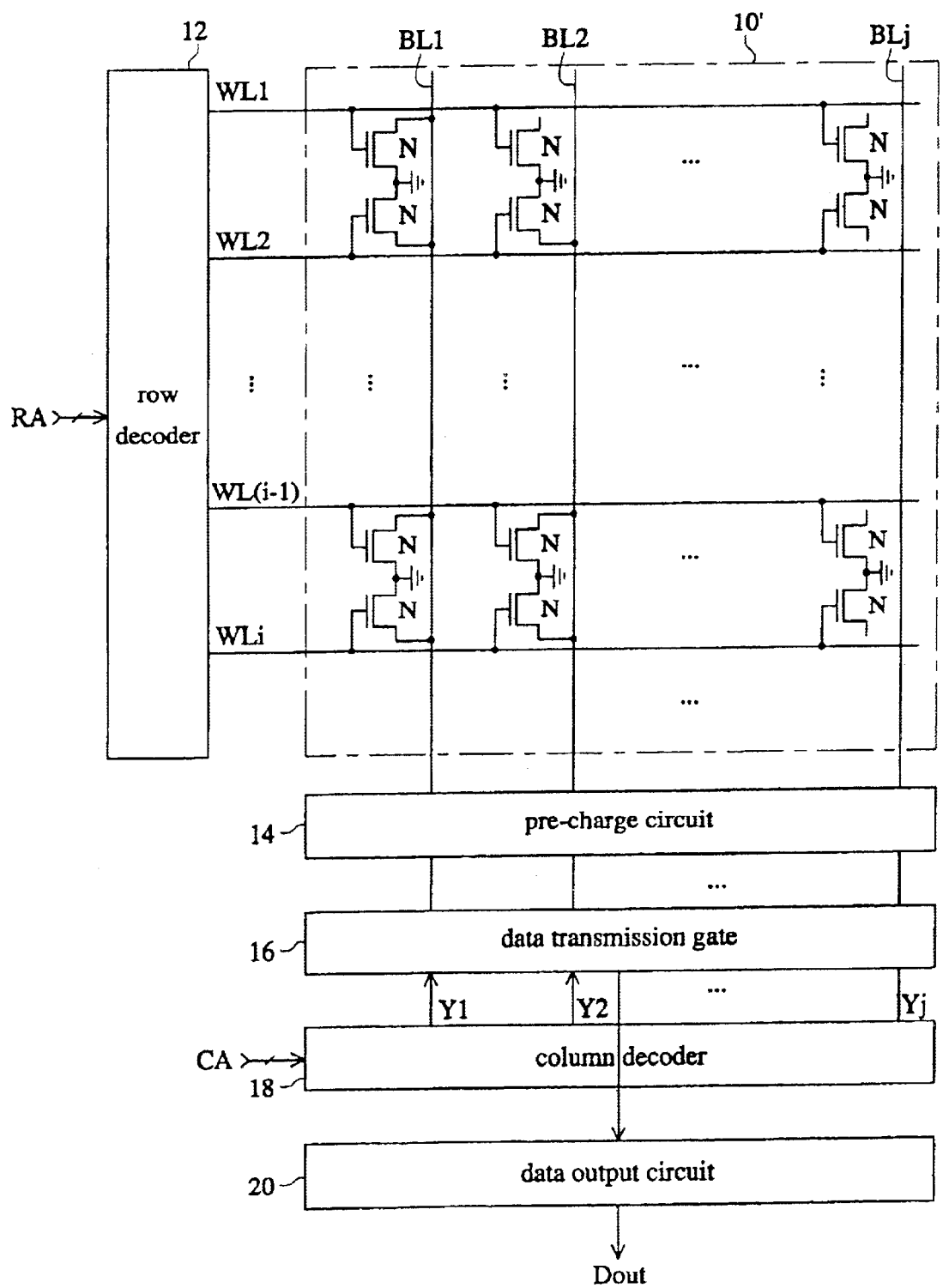
FIG. 2 illustrates a block diagram of another conventional read only memory device in accordance with another example of the conventional art.
Figure 3:
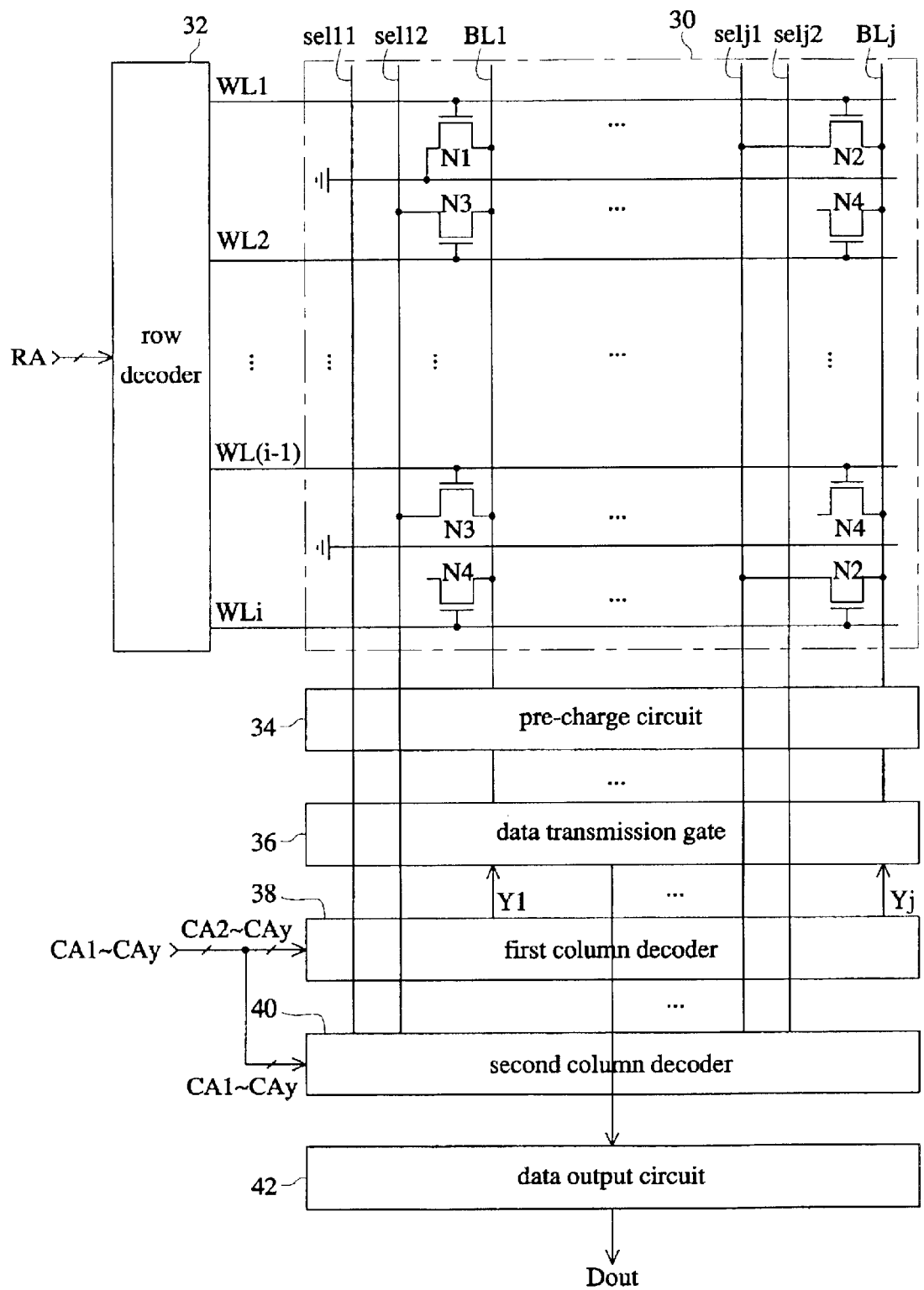
FIG. 3 illustrates a block diagram of a read only memory device including read only memory cells in accordance with an exemplary embodiment of the present invention.

FIG. 3 illustrates a block diagram of a read only memory (ROM) device including an array of ROM cells in accordance with an exemplary embodiment of the present invention. The ROM device associated with FIG. 3 includes a memory cell array 30, a row decoder 32, a pre-charge circuit 34, a data transmission gate 36, a first column decoder 38, a second column decoder 40 and a data output circuit 42. The function of each block is described below.

The memory cell array 30 includes NMOS transistors N1, N2, N3, N4 programmed with data "00", "10", "01", "11", respectively. The row decoder 32 decodes a row address RA and selects one of the word lines WL1–WLi. The pre-charge circuit 34 pre-charges selected one of bit lines BL1–BLj. The data transmission gate 36 transmits data from the bit lines BL1–BLj to data output circuit 42, in response to column selection signals Y1–Yj, respectively. The first column decoder 38 decodes a multiple bits of column address CA2–CAy except the least significant bit CA1 of a column address CA1–CAy and generates the column selection signals Y1–Yj. The second column decoder 40 decodes a column address CA1–CAy and generates selection signals to select selection signal lines (sell1, sell2), ..., (selj1, selj2). The data output circuit 42 receives data from the transmission gate 36 and outputs output data Dout.

A method for programming the ROM cell shown in FIG. 3 is described below.

If the ROM cell has electrical connections as shown in the NMOS transistor N1 associated with FIG. 3, the ROM cell is programmed to have data "00". That is, the gate of the NMOS transistor N1 is connected to the word line WL1, the drain of the NMOS transistor N1 is connected to the bit line BL1 and the source of the NMOS transistor N1 is connected to a ground voltage line.

If the ROM cell has electrical connections as shown in NMOS transistor N2 associated with FIG. 3, the ROM cell is programmed to have data "10". That is, the gate of the NMOS transistor N2 is connected to the word line WL1, the drain of the NMOS transistor N2 is connected to the bit line BLj and the source of the NMOS transistor N2 is connected to the first selection signal lines selj1.

If the ROM cell has electrical connections as shown in the NMOS transistor N3 associated with FIG. 3, the ROM cell is programmed to have data "01". That is, the NMOS transistor N3 has a gate connected to the world line WL2, the drain connected to the bit line BL1 and the source connected to the second selection line sell2.

If the ROM cell has electrical connections as shown in the NMOS transistor N4 associated with FIG. 3, the ROM cell is programmed to have data "11". That is, the NMOS transistor N4 has a gate connected to the word line WL2, the drain connected to the bit line BLj and the source having no electrical signal connection.

The read operation of the ROM device shown in FIG. 3 is described below.

Before a read operation starts, word lines WL1–WLj, bit lines BL1–BLj and selection signal lines (sell1, sell2), ..., (selj1–selj2) are precharged to a logic "low" level.

During the read operation, in the case of accessing the NMOS transistor N1 by activating the first selection signal line sell1 or the second selection signal line sell2, a word line WL1, a bit line BL1 and the first selection signal line sell1 (or the second selection signal line sell2) transit to a logic "high" level, and the other bit lines BL2–BLj, the other selection signal lines sell2, ..., selj1, selj2 (or the other selection signal lines sell1, sel21, sel22, ..., selj1, selj2) remains at a logic "low" level. Thus, the NMOS transistor N1 is turned on and a charge of the bit line BL1 is discharged to the ground voltage line. As a result, the bit line BL1 has a logic "low" level. If a column selection signal Y1 is generated, the logic "low" level signal of the bit line BL1 is output through the data transmission gate 36.

When accessing the NMOS transistor N2 by activating the first selection signal line selj1 during another read operation, the word line WL1, the bit line BLj and the first selection signal line selj1 transit to a to logic "high" level, and the other bit lines BL1-BL(j-1) and the other selection signal lines sell1, sell2, ..., selj2 maintain a logic "low" level. In this situation, since a voltage difference between the drain and source of the NMOS transistor N2 is less than a threshold voltage of the NMOS transistor N2, the NMOS transistor N2 is turned off and the bit line BLj maintains a logic "high" level. Thus, when a column selection signal Yj is generated, a logic "high" level signal of the bit line BLj is output through the data transmission gate 36.

When accessing the same NMOS transistor N2 by activating the second selection signal selj2, the word line WL1, the bit line BLj and the second selection signal line selj2 transit to a logic "high" level and the other selection signal lines sell1, sell2, ..., selj1 maintain a logic "low" level. Thus, the NMOS transistor N2 is turned on and a charge of the bit line BLj is discharged to the first selection signal line selj1, so that the bit line BLj becomes a logic "low" level. At this time, if the column selection signal Yj is generated, a logic "low" level signal of the bit line BLj is output through the data transmission gate 36.

When accessing the NMOS transistor N3 by activating the first selection signal line sell1 during yet another read operation, the word line WL2, the bit line BL1 and the first selection signal line sell1 transit to a logic "high" level, and the other selection signal lines sell2, . . . , selj2 maintain a logic "low" level. Thus, the NMOS transistor N3 is turned on and a charge of the bit line BL1 is discharged to the second selection signal line sell2, so that the bit line BL1 becomes a logic "low" level. When the column selection signal line Y1 is generated, a logic "low" level signal of the bit line BL1 is output through the data transmission gate 36.

When accessing the same NMOS transistor N3 by activating the second selection signal line sell2, the word line WL2, the bit line BL1 and the second selection signal line sell2 transit to a to logic "high" level and the other selection signal lines sell1, sel21, . . . , selj1, selj2 maintain a logic "low" level. Since voltage difference between the source and the drain of the NMOS transistor N3 is less than threshold voltage of the NMOS transistor N3, the NMOS transistor N3 is turned off and the bit line BL1 maintains a logic "high" level. If the column selection signal Y1 is generated, a logic "high" level signal of the bit line BL1 is output through the data transmission gate 36.

When accessing the NMOS transistor N4 by activating the first selection signal line selj1 or the second selection signal line selj2 during another read operation, the word line WL2, the bit line BLj and the first selection signal line selj1 (or the second selection signal selj2) transit to a to logic "high" level, the other selection signal lines sell1, sell2, . . . , selj2 (or the selection signal lines sell1, sell2, . . . , selj1) maintain a logic "low" level. Since no connection is made to the source of the NMOS transistor N4, the bit line BLj maintains a logic "high" level. Thus, when the column selection signal Yj is generated, a logic "high" level signal of the bit line BLj is output through the data transmission gate 36.

Exemplary embodiments of the ROM device of the present invention as shown in FIG. 3 can reduce leakage current since the word lines, the bit lines, and the first and second selection lines are grounded before the read operation is performed.

Further, exemplary embodiments of the ROM device of the present invention are advantageous in that one ROM cell stores two bits of data in a cell.

Further, exemplary embodiments of the ROM device of the present invention are advantageous in that parasitic capacitance of each bit line is almost the same, at a value of approximately N/2×(drain capacitance of an NMOS transistor+α)+bit line capacitance, (where α denotes drain capacitance increased due to the increased drain size of the NMOS transistor). That is, an NMOS transistor in an exemplary embodiment of the ROM device of the present invention has about half the drain capacitance of the NMOS transistors in conventional ROM devices. Accordingly, parasitic capacitances of bit lines BL1–BLj are substantially the same, and a difference in the parasitic capacitances is approximately zero.

Further, exemplary embodiments of the ROM device of the present invention do not require an additional circuit for compensating for the parasitic capacitance difference.

As a result, the problems such as layout area increase, power consumption increase and operating speed decrease may not be present.

FIGS. 4A to 4D illustrate an exemplary layout of the ROM cell in accordance with an exemplary embodiment of the present invention, wherein the ROM cell is programmed with data "00".

Figure 4A:
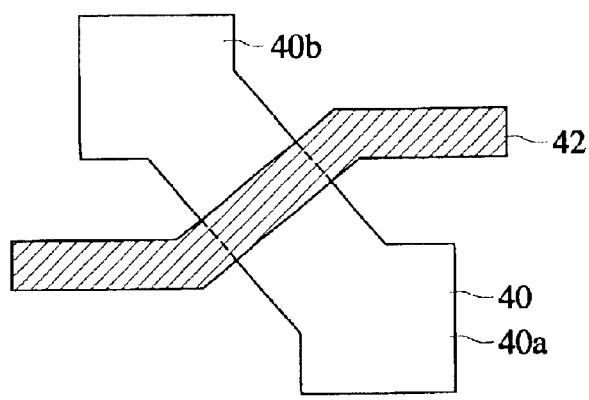
FIGS. 4A to 4D illustrate layout diagrams of a read only memory cell programmed with data "00", in accordance with an exemplary embodiment of the present invention.
Figure 4B:
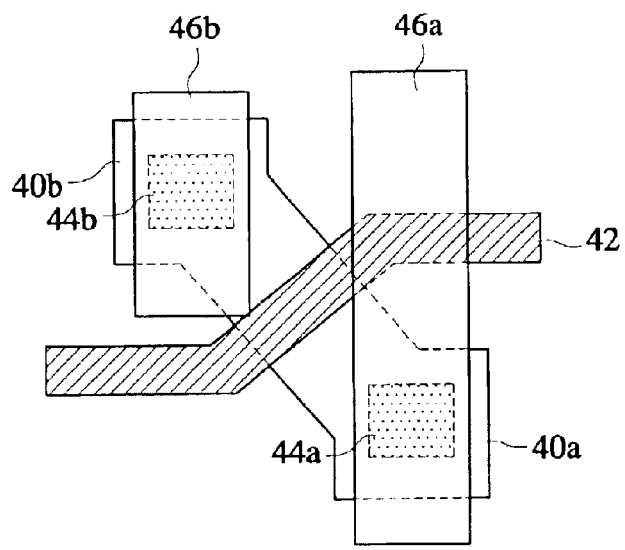

Referring to FIG. 4A, an active area 40 is arranged in a diagonal direction and a gate area 42 is formed to cross the active area 40. A drain region 40a and source region 40b are formed in the active area 40 at both sides of the gate area 42. Referring to FIG. 4B, a contact 44a and a contact 44a are formed at the drain region 40a and the source region 40b. A metal I line 46a acting as a bit line at the contact 44a is formed to extend in longitudinal direction over the gate area 42 and the drain region 40a, and then the drain area 40a and the metal I line 46b are electrically connected by contact 44a. A metal I line 46b is formed over contact 44b, and then the source area 40b and the metal I line 46b are electrically connected by contact 44b.

Figure 4C:
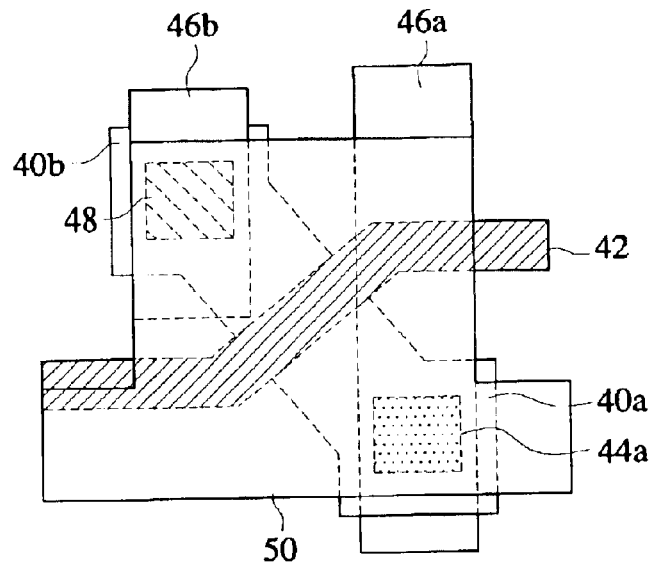
Figure 4D:
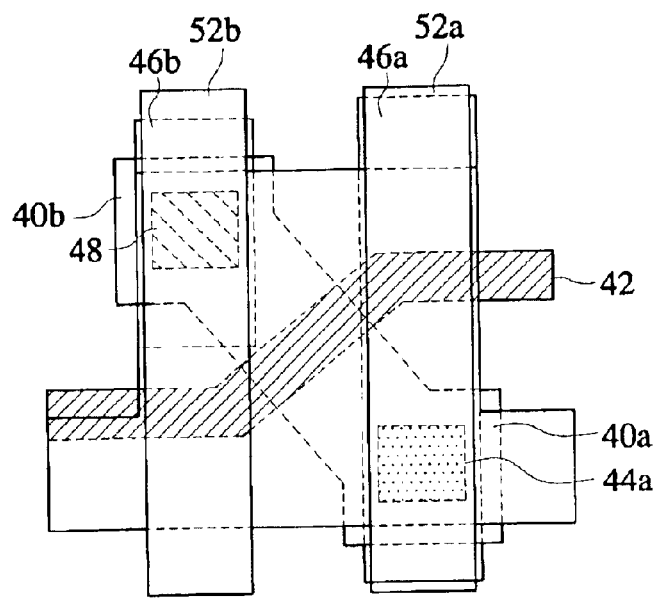

Referring to FIG. 4C, a via I contact 48 is formed on the metal I line 46b. A metal II line 50 acting as a ground voltage line is formed in the via I contact 48 and over the drain region 40a and source region 40b, thereby being electrically connected to the metal I line 46b. Referring to FIG. 4D, a metal III line 52a acting as a second selection signal line is formed over the drain region 40a and extend in longitudinal direction. The metal III line 52b acting as a first selection signal line is formed over the source region 40b and extends in longitudinal direction.

Therefore, the source region 40b is connected to the ground voltage through the metal I line 46b and the metal II line 50. However, the metal III lines 52b, 52a acting the first selection signal line and the second selection signal line are not connected to the source area 40b.

FIGS. 5A to 5D illustrate a layout of the ROM cell programmed with data "10" in accordance with an exemplary embodiment of the present invention. Like reference numeral designates like elements in FIGS. 4A to 4D and FIGS. 5A to 5D.

Figure 5A:
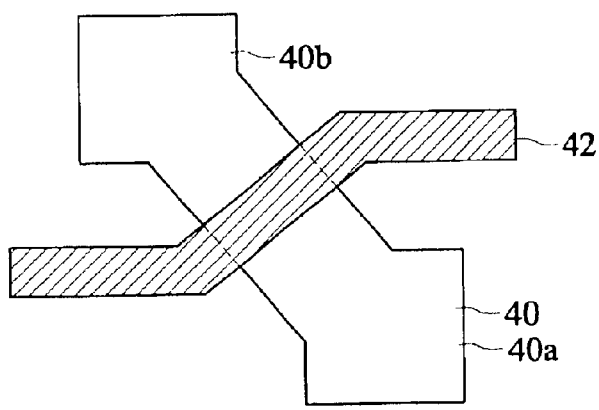
FIGS. 5A to 5D illustrate layout diagrams of a read only memory cell programmed with data "10", in accordance with an exemplary embodiment of the present invention.
Figure 5B:
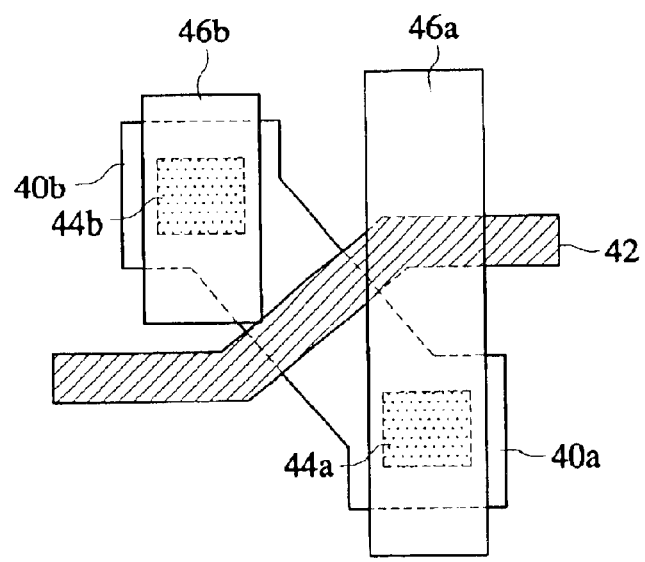
Figure 5C:
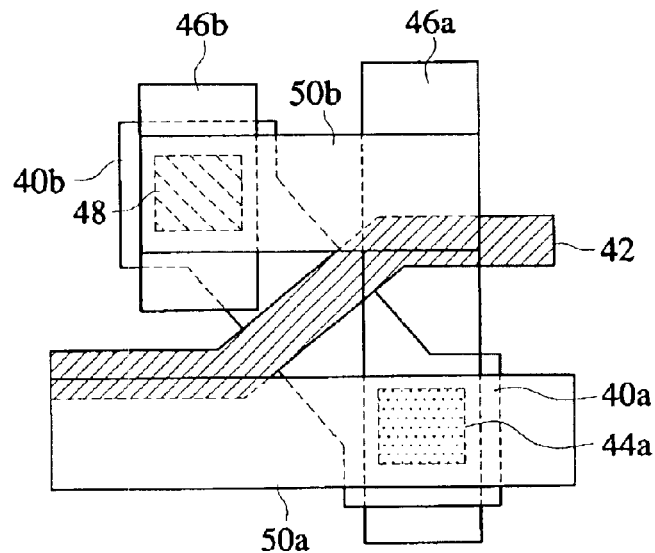

FIGS. 5A and 5B are the same as FIGS. 4A and 4B, respectively. Accordingly, explanation regarding FIG. 5A and 5B will be omitted. Referring to FIG 5C, a via I contact 48 is formed on a metal I line 46b. A metal II line 50a acting as a ground voltage line is formed over a drain region 40a and extend in a lateral direction. A metal II line 50b is formed into the via I contact 48, thereby electrically connecting the metal I line 46b. The metal II lines 50a and 50b are not connected each other.

Figure 5D:
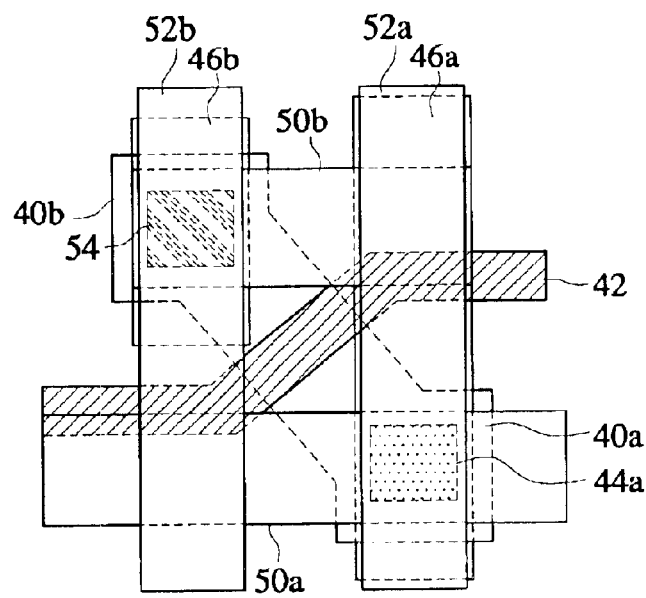

Referring to FIG. 5D, a via II contact 54 is formed on the metal II line 50b. A metal III line 52b acting as a first selection signal line is formed on the via II contact 54 and extend in lateral direction, thereby electrically connecting the metal line II 50b. A metal III line 52a acting as a second selection signal line overlaps with the metal I line 46a. That is, the metal III line 52a is formed at the same position and direction as the metal I line 46a. Thus, the source region 40b is electrically connected to the first selection signal line through the metal I line 46b, the metal II line 50b and the metal III line 52b.

Figure 6A:
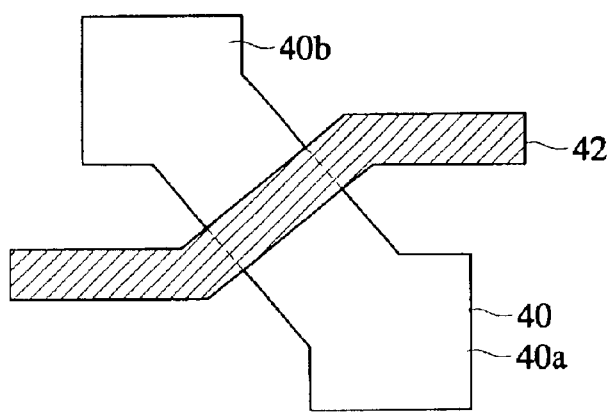
FIGS. 6A to 6D illustrate layout diagrams of a read only memory cell programmed with data "01", in accordance with an exemplary embodiment of the present invention.
Figure 6B:
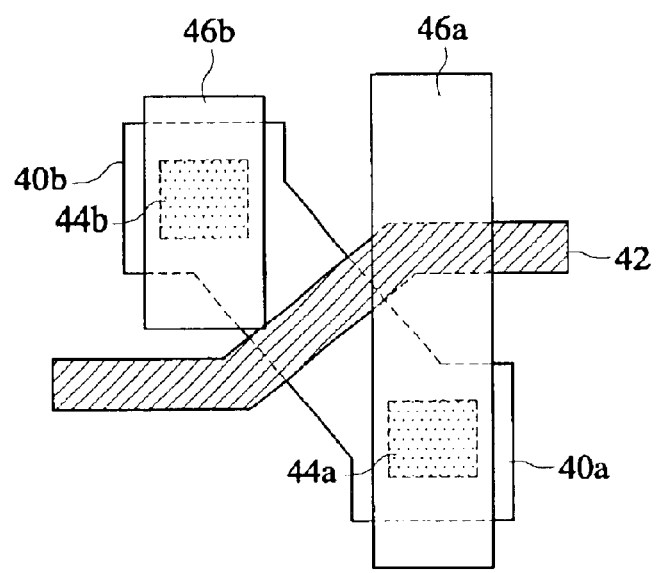
Figure 6C:
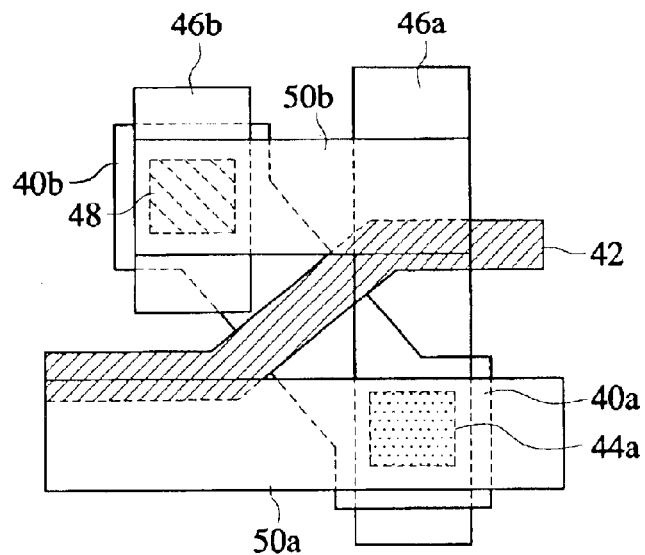

FIGS. 6A to 6D illustrate a layout of the ROM cell programmed with data "01" in accordance with an exemplary embodiment of the present invention. Like reference numeral designates like elements in FIGS. 5A to 5D and FIGS. 6A to 6D. FIGS. 6A and 6C are the same as FIG. 5A and 5C, respectively. Accordingly, explanation regarding FIG. 6A and 6C will be omitted.

Figure 6D:
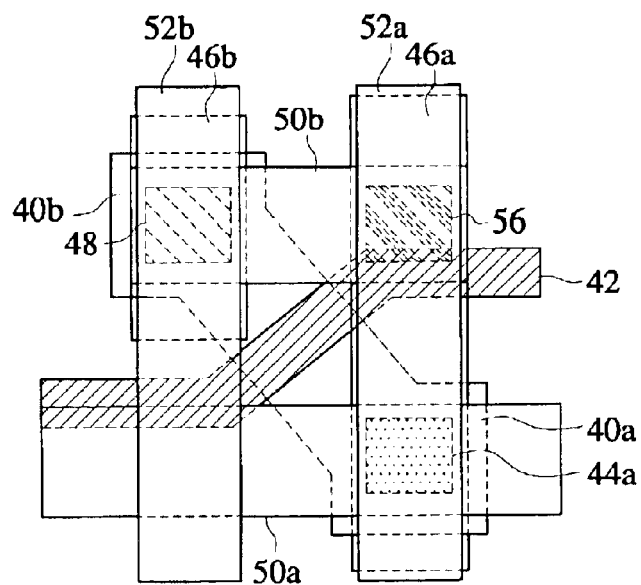

Referring to FIG. 6D, a via II contact 56 is formed on a metal II line 50b and a metal III line 52a acting as a second selection signal line is formed on the via II contact 56 and extends in lateral direction, so that the metal II line 50b and the metal III line 52a are connected to each other. The metal III line 52b acting as a first selection signal overlaps with the metal I line 46b. The source region 40b is electrically connected to the second selection signal line through the metal I line 46b, the metal II line 50b and the metal III line 52a.

Figure 7A:
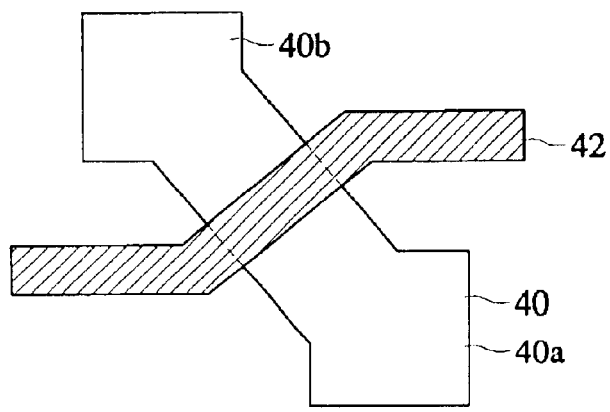
FIGS. 7A to 7D illustrate layout diagrams of a read only memory cell programmed with data "11", in accordance with an exemplary embodiment of the present invention.
Figure 7B:
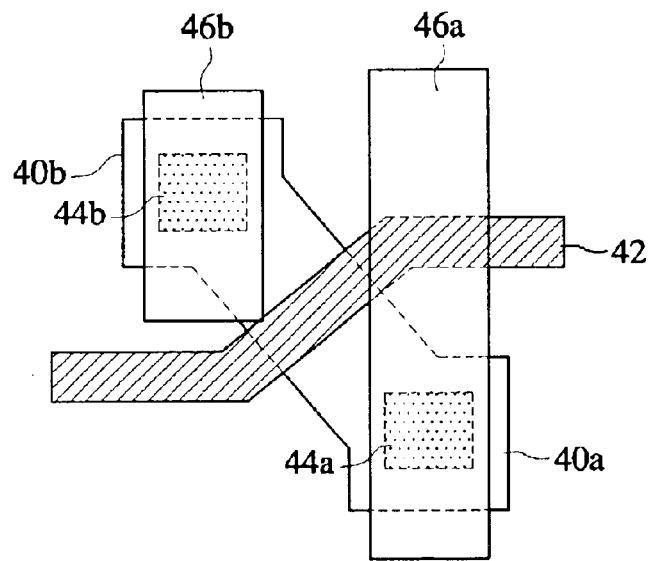
Figure 7C:
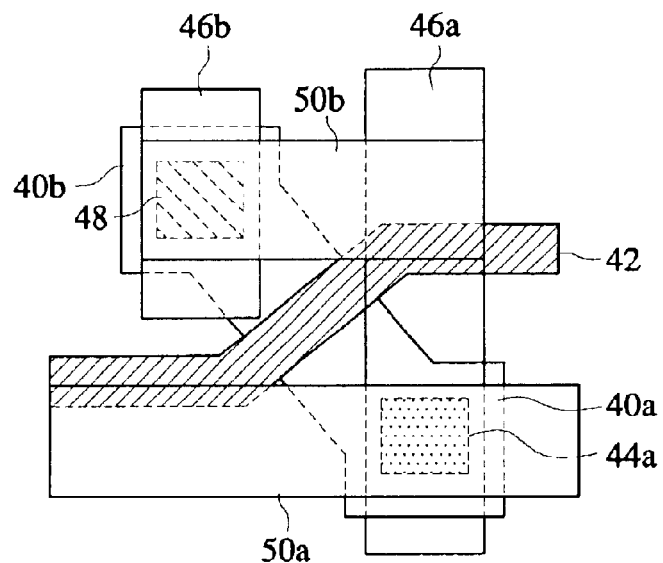

FIGS. 7A to 7D illustrate a layout of the ROM cell programmed with data "11" in accordance with an exemplary embodiment of the present invention. Like reference numeral designates like elements in FIGS. 6A to 6D and FIGS. 7A to 7D. FIGS. 7A and 7C are the same as FIG. 6A and 6C, respectively. Accordingly, explanation regarding FIG. 7A and 7C will be omitted.

Figure 7D:
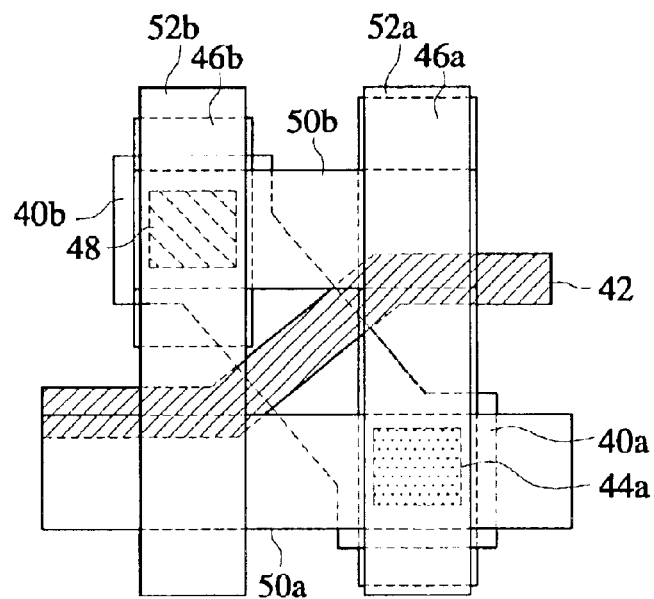

Referring to FIG. 7D, a metal III line 52a acting as a second selection signal line overlaps with a metal I line 46a. That is, the metal III line 52a is formed on the same position and direction as the metal I line 46a. A metal III line 52b acting as a first selection signal line overlaps with a metal I line 46b. That is, the metal III line 52b is formed on the same position and direction as the metal I line 46b.

As described above, the exemplary embodiment of the ROM cell of the present invention have the active area and the gate area which are arranged diagonally to cross with each other, so that the first and second selection signal lines, the bit line and the ground voltage line may be effectively arranged to reduce layout size.

Further, since the metal line acting as the bit line is the lowest metal line (i.e. the metal line is formed under the ground voltage line and the selection signal lines), in exemplary embodiments of the present invention parasitic capacitance of the bit line may be reduced.

Further, since the ROM cell of exemplary embodiments of the present invention is programmed by using a back-end layer, it is easier to correct data. Further, since two bits of data can be stored in a ROM cell, integration degree of the ROM device may not decrease even though the back-end layer programming may prevent the integration degree of the ROM device from being increased.

The ROM device in accordance with exemplary embodiments of the present invention employs two selection signal lines and programs two bits of data in a ROM cell, but is not limited thereto. The ROM device of exemplary embodiments of the present invention may employ n signal lines (n=4, 8, . . . ) and program n bits of data in a cell.

While exemplary embodiments of the invention have been particularly shown and described with reference to the exemplary embodiments thereof, it will be understood by those skilled in the art that the foregoing and other changes in form and details may be made therein without departing from the spirit and scope of the invention.

What is claimed is:

1. A read only memory (ROM) cell comprising:
   a first terminal connected to a word line;
   a second terminal connected to a bit line; and
   a third terminal connected to a ground voltage line, a first selection signal line, a second selection signal line, or not connected to any signal lines,
   whereby the ROM cell stores two bits of data according to the connection of the third terminal.

2. The ROM cell according to claim 1, wherein the ROM cell is a NMOS transistor.

3. The ROM cell according to claim 1, wherein the word line, the bit line and the first and second selection signal lines are at ground voltage level before a read operation starts, and the word line, the bit line and one of the first and second selection signal lines transit to a power supply voltage level during the read operation.

4. The ROM cell according to claim 1, wherein the word line is selected by a row address, and the bit line, the first selection signal line and the second selection signal line are selected by a column address.

5. A method for programming a ROM cell including a first terminal connected to a word line, a second terminal connected to a bit line, and a third terminal, comprising the steps of:
   programming the ROM cell with data "00" by connecting the third terminal to a ground voltage line;
   programming the ROM cell with data "10" by connecting the third terminal to a first selection signal line;
   programming the ROM cell with data "01" by connecting the third terminal to a second seletion signal line; and
   programming the ROM cell with data "11" by not connecting the third terminal.

6. The method according to claim 5, wherein the word line is selected by a row address, and the bit line and the first and second selection signal lines are selected by a column address.

7. A method for forming a layout of a ROM cell having a first terminal connected to a word line, a second terminal connected to a bit line, and a third terminal connected to a ground voltage line, a first selection signal line, a second selection signal line, or not connected to any signal lines, comprising the steps of:
   arranging an active area acting as the second and third terminals in diagonal direction;
   arranging the first terminal to cross the active area;
   arranging the bit line on the second terminal to extend in a longitudinal direction;
   arranging a ground voltage line substantiallyperpendicular to the bit line; and
   arranging the first and second slection signal lines substantially in the same direction as the bit line.

8. The method according to claim 6, wherein the step of arranging the bit line further includes:
   forming a first contact and a second contact on one of the second terminal and an area of the third terminal, respectively;
   arranging a first metal line acting as the bit line on the first contact at the area of the second terminal to extend in the longitudinal direction; and
   arranging a second metal line on the second contact at the area of the third terminal to extend in the longitudinal direction.

9. The method according to claim 8, wherein the step of arranging the ground voltage line includes:
   forming a third contact on the second metal line;
   forming a third metal line on the third contact and forming a fourth metal line acting as the ground voltage line on the first metal line to extend in a lateral direction.

10. The method according to claim 9, wherein the step of arranging the ground voltage line further includes:
    arranging the third metal line and the fourth metal line to be connected to each other for programming the ROM cell with data "00".

11. The method according to claim 9, wherein the step of arranging the first and second selection signal lines for programming the ROM cell with data "10" includes:
    forming a fourth contact on the third metal line: and
    forming a fifth metal line acting as the first selection signal line on the fourth contact substantially in the same direction as the second metal line, and forming a sixth metal line acting as the second selection line to extend substantially in the same direction as the first metal line.

12. The method according to claim 9, wherein the step of arranging the first and second selection signal lines for programming the ROM cell with data "01" includes:

forming a fourth contact on the third metal line;

forming a fifth metal line acting as the second selection signal line on the fourth contact to extend substantially in the same direction as the first metal line; and forming a sixth metal line acting as the first selection singal line to extend substantially in the same direction as the second metal line.

13. The method according to claim 9, wherein the arranging the first and second selection signal lines for programming the ROM cell with data "11" includes:

arranging a fifth metal line acting as the first selection signal line to extend substantially in the same direction as the second metal line; and arranging a sixth metal line acting as the second selection signal line to extend substantially in the same direction as the first metal line.

14. A ROM device comprising:

a plurality of word lines;

a plurality of bit lines;

a plurality of first selection signal lines;

a plurality of second selection signal lines;

a plurality of ROM cells, each including a first terminal connected to a word line of the word lines, a second terminal connected to a bit line of the bit lines and a third terminal connected to a ground voltage line, a first selection signal line of the first selection signal lines, or a second selection signal line of the second selection signal lines, or not connected to any signal lines.

15. The ROM device according to claim 14, wherein the word lines, the bit lines and the first and secod selection signal lines are at ground voltage level before a read operation starts, and selected word line and bit line of the word lines and bit lines transit to a power supply voltage level and one of the first and second selection signal lines transisit to the power supply voltage after the read operation starts.

16. The ROM device according to claim 14, wherein the word lines are selected by decoding a row address, the first and second selection signal lines are selected by decoding a column address including a plurality of bits, and the bit lines are selected by decoding the column address excluding the least significant one bit thereof.

17. The ROM device according to claim 14, wherein the each ROM cell is programmed with data "00" when the source is connected to the ground voltage line.

18. The ROM device according to claim 14, wherein the each ROM cell is programmed with data "10" when the third terminal is connected to the first selection signal line of the first selection signal lines.

19. The ROM device according to claim 14, wherein the each ROM cell is programmed with data "01" when the third terminal is connected to the second selection signal line of the second selection signal lines.

20. The ROM device according to claim 14, wherein the ROM cell is programmed with data "11" when the source has no electrical connection with any signal line.

21. A read only memory(ROM) cell comprising:

a first terminal connected to a word line;

a second terminal connected to a bit line; and a third terminal connected to a ground voltage line, one of $2^n$ selection signal lines(where n is a integer greater than 1), or not connected to any signal lines, whereby the ROM cell stores $2^n$ bits of data according to the connection of the third terminal.

* * * * *